United States Patent
Chiang et al.

(10) Patent No.: US 10,892,010 B2
(45) Date of Patent: Jan. 12, 2021

(54) METHOD FOR CONTROLLING ACCUMULATED RESISTANCE PROPERTY OF RERAM DEVICE

(71) Applicant: MACRONIX INTERNATIONAL CO., LTD., Hsinchu (TW)

(72) Inventors: Kuang-Hao Chiang, Taoyuan (TW); Yu-Hsuan Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/274,301

(22) Filed: Feb. 13, 2019

(65) Prior Publication Data
US 2020/0258573 A1  Aug. 13, 2020

(51) Int. Cl.
| G11C 11/00 | (2006.01) |
| G11C 13/00 | (2006.01) |
| H01L 45/00 | (2006.01) |
| H01L 27/24 | (2006.01) |

(52) U.S. Cl.
CPC ...... *G11C 13/0069* (2013.01); *G11C 13/0007* (2013.01); *G11C 13/0097* (2013.01); *H01L 27/24* (2013.01); *H01L 45/146* (2013.01); *H01L 45/1608* (2013.01)

(58) Field of Classification Search
CPC ............ G11C 13/0069; G11C 13/0097; G11C 13/0007; G11C 13/0002; G11C 13/0009; H01L 27/24; H01L 45/146; H01L 45/1608; H01L 21/02323; H01L 21/3225; H01L 45/08; H01L 45/1206; H01L 45/145
See application file for complete search history.

(56) References Cited

U.S. PATENT DOCUMENTS

| 9,306,160 | B2 | 4/2016 | Chiang et al. |
| 2008/0316792 | A1 | 12/2008 | Philipp et al. |
| 2009/0194760 | A1 | 8/2009 | Gosain et al. |
| 2013/0193394 | A1* | 8/2013 | Lengade ............ H01L 45/146 257/4 |
| 2015/0372228 | A1* | 12/2015 | Chiang ............... H01L 45/12 257/2 |

(Continued)

FOREIGN PATENT DOCUMENTS

| TW | 201001769 A | 1/2010 |
| TW | I553854 B | 10/2016 |

OTHER PUBLICATIONS

TIPO Office Action dated Aug. 26, 2019, TW Application # 108104785, pp. 1-6.

(Continued)

*Primary Examiner* — Uyen Smet
(74) *Attorney, Agent, or Firm* — McClure, Qualey & Rodack, LLP

(57) ABSTRACT

A method for controlling accumulated resistance property of a ReRAM device, wherein the method includes steps as follows: A first programing pulse set is firstly applied to a ReRAM device for acquiring a reference accumulated resistance distribution. A second programing pulse set is then provided according to the reference accumulated resistance distribution, and the second programing pulse set is applied to the ReRAM device, to make the ReRAM device having a predetermined accumulated resistance distribution.

6 Claims, 3 Drawing Sheets

(56) References Cited

U.S. PATENT DOCUMENTS

2018/0342297 A1* 11/2018 Kim .................... G11C 13/004

OTHER PUBLICATIONS

Liu, Jicheng, Notice of Review of the Intellectual Property Office of the Ministry of Economic Affairs, issued on Aug. 26, 2018 in Republic of China, Application No. 108104785, pp. 1-5.
Chiang, et al: "A Si-doped High-Performance WOx Resistance Memory Using a Novel Field-Enhanced Structure"; 978-1-4673-8833-7/16/$31.00 © 2016 IEEE; pp. 1-4.
Wu, et al: "Device and circuit optimization of RRAM for Neuromorphic computing"; 978-1-5386-3559-9/17/$31.00 © 2017 IEEE; pp. 11.5.1-11.5.4.

* cited by examiner

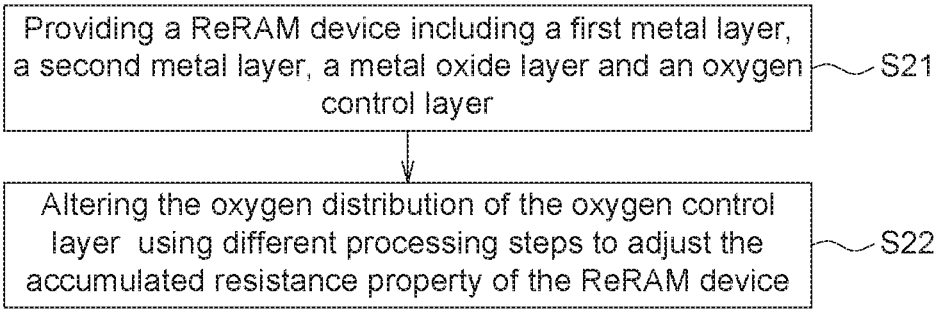
FIG. 2A
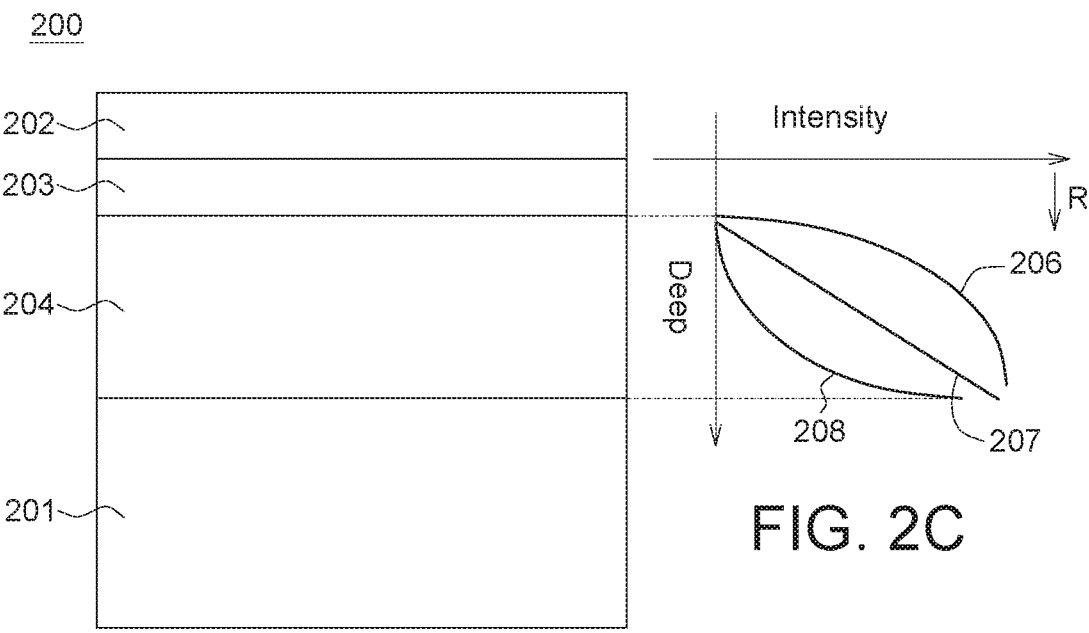
FIG. 2B
FIG. 2C

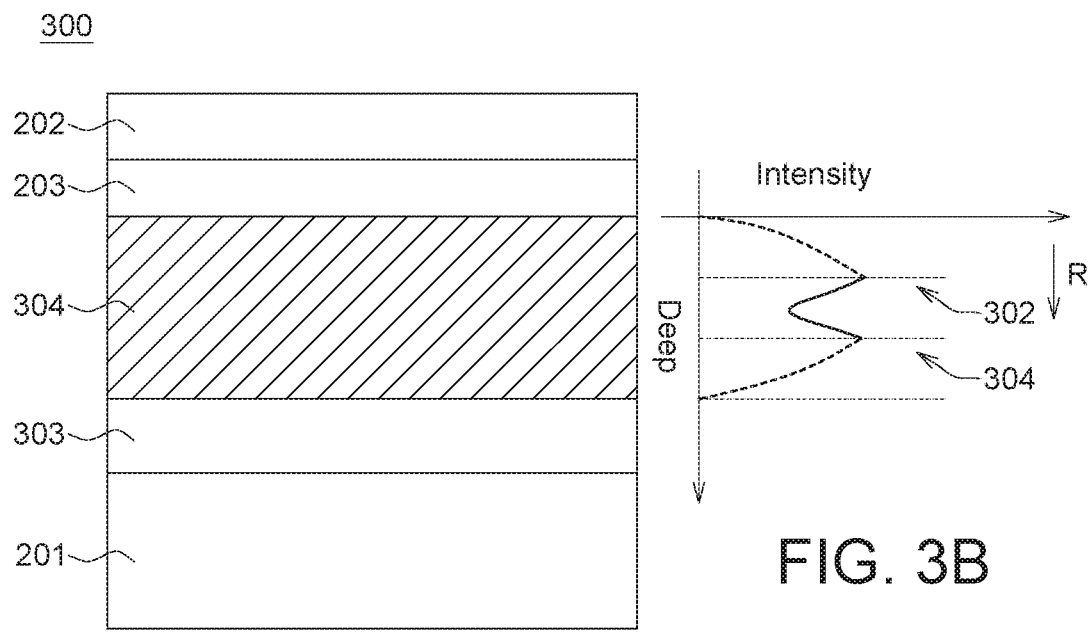
FIG. 3A
FIG. 3B
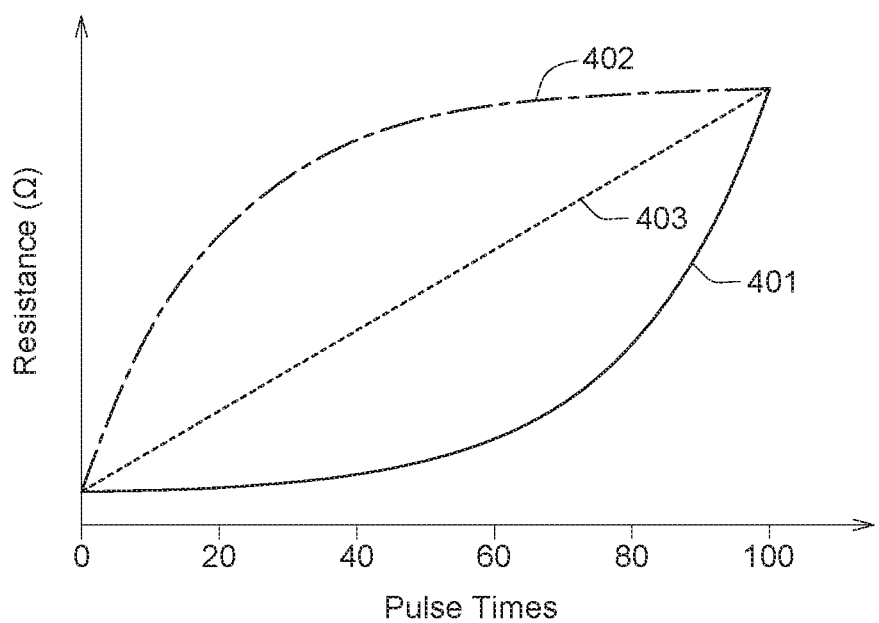
FIG. 4

METHOD FOR CONTROLLING ACCUMULATED RESISTANCE PROPERTY OF RERAM DEVICE

BACKGROUND

Technical Field

The present invention relates to a method for controlling a resistive random-access memory (ReRAM) device, especially to a method for controlling the accumulated resistance property of the ReRAM device.

Description of the Related Art

Resistive memory devices, such as resistive random-access memory (ReRAM) devices, can apply difference of resistance resulted from different pulse voltages to respectively designate "0" or "1" states of the memory cells thereof for implementing the erase/program operation.

A typical ReRAM device comprises a vertical arrangement of metal layer/memory layer/metal layer (MIM) structure which can be used to achieve high-density storage by means of a crossbar array configuration. The memory layer may be a resistance switching layer consisting of transition metal oxides (TMO), and the oxide quality of the TMO may have a huge impact on switching characteristics of the ReRAM device. Currently, binary oxides, such as titanium oxides (TiOx), have been used to composite the resistance switching layer.

In recent years, with the rise of artificial intelligence, circuit-like neural network (NN) systems and the Internet of Things (IoTs), the ReRAM device that has advantages of high device density, high programming/erasing speed, good three-dimensional integration, available for multi-value implementation, low power consumption and the like can meet the requirements of electronic synaptic applications of the artificial intelligence, the NN systems and the IoTs and are considered to be one of the most promising candidate components to develop the artificial intelligence, the NN systems and the IoTs. However, there is still a lot of variability in programming/erasing of the ReRAM device relying upon the filamentary resistive switching of the TMO; current leakage may easily occur in a three-dimensional (3D) construction configured by the ReRAM device due to the variations; and these are not conducive to the application of the NN system.

Therefore, there is a need of providing a method for controlling the accumulated resistance property of the ReRAM device to obviate the drawbacks encountered from the prior art.

SUMMARY

One aspect of the present disclosure is to provide a method for controlling accumulated resistance property of a ReRAM device, wherein the method includes steps as follows: A first programing pulse set is firstly applied to a ReRAM device for acquiring a reference accumulated resistance distribution. A second programing pulse set is then provided according to the reference accumulated resistance distribution, and the second programing pulse set is applied to the ReRAM device, to make the ReRAM device having a predetermined accumulated resistance distribution.

Another aspect of the present disclosure is to provide a method for controlling accumulated resistance property of a ReRAM device, wherein the method includes steps as follows: A ReRAM device including a first metal layer, a second metal layer, a first metal oxide layer and an oxygen control layer is provided, wherein the first metal oxide layer is disposed between the first metal layer and the second metal layer; the oxygen control layer is disposed between the first metal oxide layer and one of the first metal layer and the second metal layer. The oxygen content of the oxygen control layer is adjusted to make the oxygen control layer having a predetermined accumulated resistance property when a predetermined programming pulse set is applied the ReRAM device.

In accordance with the aforementioned embodiments of the present disclosure, a method for controlling accumulated resistance property of a ReRAM device is provided, wherein a first programing pulse set is firstly applied to a ReRAM device for acquiring a reference accumulated resistance distribution. According to the reference accumulated resistance distribution, a second programing pulse set in which at least one of the voltages, the currents and the pulse widths is different from that of the first programing pulse set is provided and then applied to perform an incremental step pulse programming (ISSP), so as to make the ReRAM device having a predetermined accumulated resistance distribution. Alternatively, several processes for manufacturing a ReRAM device having an oxygen control layer is adopted to adjusted an oxygen distribution of the oxygen control layer, so as to make the oxygen control layer of the ReRAM device having a predetermined oxygen distribution, and the ReRAM device can have a predetermined accumulated resistance distribution when a predetermined programing pulse set is applied thereon. By these approaches, the programming/erasing variations of the ReRAM device can be decreased, a multi-level-cell (MLC) application of the ReRAM device can be improved, and the ReRAM device can be more eligible for the NN systems.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 2A is a flow chart illustrating a method for controlling accumulated resistance property of a ReRAM device, according to one embodiment of the present disclosure.

FIG. 2B is a cross-sectional view illustrating a ReRAM device, according to one embodiment of the present disclosure.

FIG. 2C is a diagram illustrating different oxygen distributions in the oxygen control layer of the ReRAM device as depicted in FIG. 2B.

FIG. 3A is a cross-sectional view illustrating a ReRAM device, according to another embodiment of the present disclosure.

FIG. 3B is a diagram illustrating different oxygen distribution in an oxygen control layer of the ReRAM device as depicted in FIG. 3A.

FIG. 4 is a diagram illustrating the accumulated resistance of three ReRAM devices versus the pulse number when a predetermined programing pulse set is respectively applied on the three ReRAM devices having different oxygen distributions in their oxygen control layers, according to one embodiment of the present disclosure.

DETAILED DESCRIPTION

The embodiments as illustrated below provide a method for controlling accumulated resistance property of a ReRAM device to decrease the programming/erasing variations of the ReRAM device and make the ReRAM device more eligible for the NN systems. The present disclosure will now be described more specifically with reference to the following embodiments illustrating the structure and arrangements thereof.

Figure 1A:
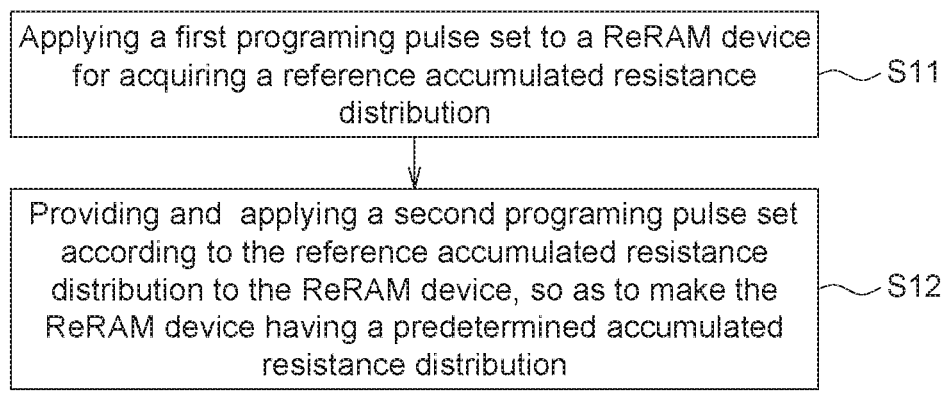
FIG. 1A is a flow chart illustrating the method for controlling accumulated resistance property of a ReRAM device, according to one embodiment of the present disclosure.
Figure 1B:
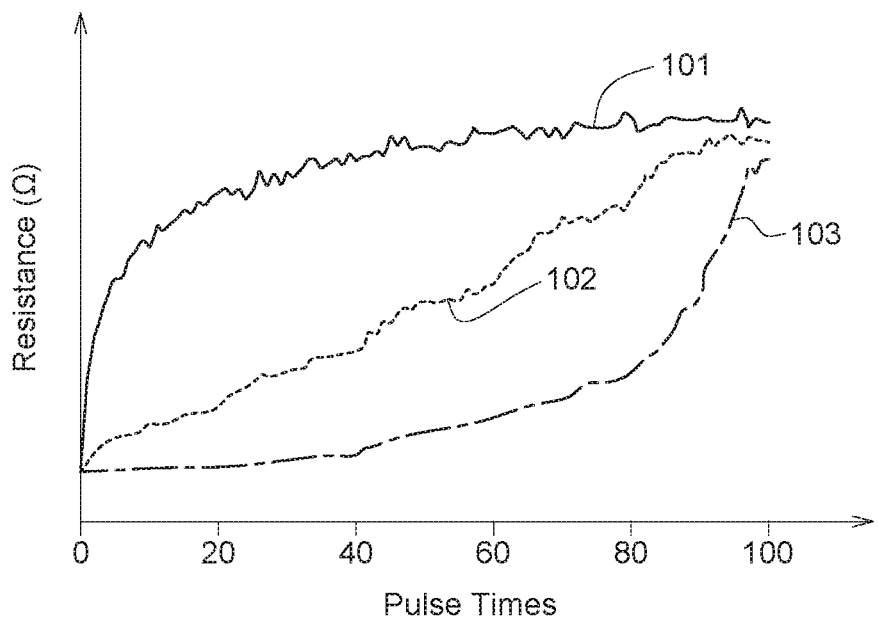
FIG. 1B is a diagram illustrating the accumulated resistance of a ReRAM device versus the pulse number when three different programing pulse sets are respectively applied thereon, according to one embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals, FIG. 1A is a flow chart illustrating the method for controlling accumulated resistance property of a ReRAM device, according to one embodiment of the present disclosure. FIG. 1B is a diagram illustrating the accumulated resistance of a ReRAM device versus the pulse number when three different programming pulse sets are respectively applied thereon, according to one embodiment of the present disclosure.

The method for controlling accumulated resistance property of a ReRAM device includes steps as follows: A first programing pulse set is firstly applied to a ReRAM device for acquiring a reference accumulated resistance distribution (see step S11). The curve 101 as depicted in FIG. 1B represents the reference accumulated resistance distribution acquired after an ISSP using the first programing pulse set is performed on the ReRAM device. In the present embodiment, each pulse in the first programing pulse set has a voltage about 2.6V, a current about 200 µA and a pulse width about 500 nanosecond (ns). The curve 101 may be a logarithmic function, wherein the accumulated resistance may be logarithmically increased over the pulse number.

After an erasing process is performed, a second programing pulse set is then provided according to the reference accumulated resistance distribution (the curve 101), and the second programing pulse set is applied to the ReRAM device, to make the ReRAM device having a predetermined accumulated resistance distribution (see step S12). As depicted in FIG. 1B, the curve 102 represents the predetermined accumulated resistance distribution acquired after an ISSP using the second programing pulse set is performed on the ReRAM device. In the present embodiment, the second programing pulse set has five programing pulse subsets each of which has twenty pluses respectively with different voltages of 2.0V, 2.2V, 2.4V, 2.6V and 2.8V, and each pulse of the five programing pulse subsets has an identical current about 200 µA and an identical pulse width about 500 ns. The curve 102 may be a liner function, wherein the accumulated resistance may be increased proportionally over the increase of the pulse number.

It should be appreciated that each programing pulse of the programing pulse set, in the present disclosure, applied to the ReRAM device is not limited to an electromagnetic pulse resulted from a voltage and current operation. Any type of energy that can cause resistance change of the ReRAM device can serve as the programing pulse of the programing pulse set applied to the ReRAM device. In addition, although each programing pulse of the programing pulse set, in the present disclosure, may have an identical current and an identical pulse width, yet in other embodiments of the present disclosure, the programing pulses of the programing pulse set can have different currents and different pulse widths.

In some other embodiment, after an erasing process is performed, a third programming pulse set can be then applied to the ReRAM device, according to the curves 101 and 102, to make the ReRAM device having another predetermined accumulated resistance distribution, As depicted in FIG. 1B, the curve 103 may represent the predetermined accumulated resistance distribution acquired after an ISSP using the third programing pulse set is performed on the ReRAM device. In the present embodiment, the third programing pulse set has five programing pulse subsets each of which has twenty pluses respectively with different voltages of 1.6V, 1.8V, 2.0V, 2.2V and 2.8V, and each pulse of the five programing pulse subsets has an identical current about 200 µA and an identical pulse width about 500 ns. The curve 103 may be an exponential function, wherein the accumulated resistance may be exponentially increased over the increase of the pulse number.

It can be determined that the accumulated resistance distribution of a ReRAM device (i.e. the curve of the accumulated resistance versus the pulse number) can be altered by adjusting at least one of the voltages, the currents and pulse widths of the programing pulse set applied to the same ReRAM device. By these approaches, the programming/erasing variations of the ReRAM device can be decreased, the set and reset states of the ReRAM device can be determined more precise, the application of the ReRAM device can be improved, and the ReRAM device can be more eligible for the NN systems.

For example, the ReRAM device can be applied in an NN system for performing a facial-recognition, and the first programing pulse set, the second programing pulse set and the third programing pulse set are respectively applied to the ReRAM device for performing ISSP. As a result, the facial-recognition adopting the first programing pulse set (to make the ReRAM device having the accumulated resistance distribution shown as the curve 101) has a precision about 30%; the facial-recognition adopting the second programing pulse set (to make the ReRAM device having the accumulated resistance distribution shown as the curve 102) has a precision about 70%; and the facial-recognition adopting the third programing pulse set (to make the ReRAM device having the accumulated resistance distribution shown as the curve 103) has a precision about 92%, It can be indicated that the accumulated resistance distribution shown as the curve 103 resulted from the third programing pulse set applied to the ReRAM device is more eligible for the NN systems to perform the facial-recognition. Such that it can be proved that by adjusting at least one of the voltages, the currents and the pulse widths in a programming pulse set applied to a ReRAM device, the accumulated resistance distribution of the ReRAM device can be alter to make it more eligible for the NN systems.

It should be appreciated that although, in the aforementioned embodiments, merely the voltage of the first programing pulse set, the second programing pulse set and the third programing pulse set is adjusted, and the pulses of the first programing pulse set, the second programing pulse set and the third programing pulse set have an identical current and an identical pulse width, but the way for adjusting of the programing pulse sets may not be limited by these regards. In some embodiments of the present disclosure, the voltage, the current and the pulse width of each programing pulse encompassed in the programming pulse sets can be adjusted and different from the corresponding pulse of the programming pulse set used to result in the reference accumulated resistance distribution.

The accumulated resistance property of the ReRAM device can be adjusted by altering the physical structures thereof during the processing steps for fabricating the same. For example, FIG. 2A is a flow chart illustrating the method for controlling accumulated resistance property of a ReRAM device, according to another embodiment of the present disclosure. The method for controlling accumulated resistance property of a ReRAM device includes steps as follows: A ReRAM device 200 including a first metal layer 201, a second metal layer 202, a metal oxide layer 203 and an oxygen control layer 204 is provided (see step S21).

FIG. 2B is a cross-sectional view illustrating a ReRAM device 200, according to one embodiment of the present disclosure. The first metal layer 201 faces to the second metal layer 202. The first metal layer 201 and the second metal layer 202 may made of identical or different material. In some embodiments of the present disclosure, the first metal layer 201 and the second metal layer 202 may made of identical material, and the first metal layer 201 and the second metal layer 202 can be formed of a metal selected from a group consisting of W, Ti, TiN, AI, Ni, Cu, Zr, Nb, Ta, Yb, Tb, Y, La, Sc, Hf, Zr, Cr, V, Zn, Mo, Re, Ru, Co, Rh, Pd, and Pt, or any combinations of these metals.

The metal oxide layer 203 is disposed between the first metal layer 201 and the second metal layer 202. In some embodiments of the present disclosure, the metal oxide layer 203 can be formed of a metal oxygen compound represented by AOx, wherein A is a metal selected from a group consisting of W, Ti, TiN, Al, Ni, Cu, Zr, Nb, and Ta, or any combinations of these metals.

The oxygen control layer 204 is disposed between the metal oxide layer 203 and one of the first metal layer 201 and the second metal layer 202. In the present embodiment, the oxygen control layer 204 is disposed between the metal oxide layer 203 and the second metal layer 202, and the oxygen control layer 204 can be formed of a compound represented by AOxBy, wherein A is a metal selected from a group consisting of W, Ti, TiN, Al, Ni, Cu, Zr, Nb, and Ta, or any combinations of these metals, and B is an element selected from a group consisting of N, Si, Ge, As, Ga, In, and P, or any combinations of these elements.

The accumulated resistance property of the ReRAM device 200 can be adjusted by altering the oxygen distribution (the x-to-y ratio of the compound of AOxBy at different locations) of the oxygen control layer 204 using different processing steps (see Step S22). For example, the oxygen control layer 204 can be formed by at least one deposition process, such as chemical vapor deposition (CVD) or physical vapor deposition (PVD), and the oxygen distribution of the oxygen control layer 204 can be adjusted by the deposition process for forming the same. During the deposition process, the oxygen content at different locations of the oxygen control layer 204 can be tuned by adjusting the content and speed of the oxygen gas involved in the reaction gas.

FIG. 2C is a diagram illustrating different oxygen distributions in the oxygen control layer 204 of the ReRAM device 200 as depicted in FIG. 2B. The oxygen content of the oxygen control layer 204 may be increased in gradient manner along a direction R from the metal oxide layer 203 to the first metal layer 201 and reach a maximum. In one embodiment of the present disclosure, the oxygen content of the oxygen control layer 204 may be gradually increased at an increasing rate to form the oxygen distribution as shown by the curve 206 in another embodiment, the oxygen content of the oxygen control layer 204 may be gradually increased at a decreasing rate to form the oxygen distribution as shown by the curve 208; and in yet another embodiment, the oxygen content of the oxygen control layer 204 may be gradually increased at an average speed to form the oxygen distribution as shown by the curve 207.

However, the way for altering the oxygen distribution of the oxygen control layer 204 may not be limited by this regard. In some embodiment of the present disclosure, a thermal stress may be applied to drive a plurality of oxygen atoms into the oxygen control layer 204 from the metal oxide layer 203, after the first metal layer 201, the second metal layer 202, the metal oxide layer 203 and the oxygen control layer 204 are formed. The thermal stress, for example can be a thermal annealing process, FIG. 3A is a cross-sectional view illustrating a ReRAM device 300, according to yet another embodiment of the present disclosure. FIG. 3B is a diagram illustrating different oxygen distribution in an oxygen control layer of the ReRAM device as depicted in FIG. 3A. The structure of the ReRAM device 300 is similar to that of the ReRAM device 200, except that the ReRAM device 300 further include another metal oxide layer 303 disposed between the first metal layer 201 and the oxygen control layer 304, In the present embodiment, the metal oxide layers 303 and 203 can be made of the same material.

By adjusting the amount of thermal stress applied to the metal oxide layer 203 and 303 can alter the oxygen distribution of the oxygen control layer 304. For example, in the present embodiment, the oxygen content may be increase along the direction R from the metal oxide layer 203 to reach a first local maximum 302, then gradually decreased and further increased again to reach a second local maximum 304, and subsequently reduced until reach to the metal oxide layer 303, FIG. 4 is a diagram illustrating the accumulated resistance of three ReRAM devices versus the pulse number when a predetermined programming pulse set is respectively applied on the three ReRAM devices having different oxygen distributions (the curves 206, 207 and 208 as depicted in FIG. 2C) in their oxygen control layers 204, according to one embodiment of the present disclosure. The curves 401, 402 and 403 respectively represent the accumulated resistance distributions of these three ReRAM devices having the different oxygen distributions 206, 207 and 208. According to FIG. 4, it can be also proved that the accumulated resistance property of the ReRAM device 200 can be adjusted by altering the oxygen distribution of the oxygen control layer 204 to make the ReRAM device 200 being more eligible for the NN systems.

In accordance with the aforementioned embodiments of the present disclosure, a method for controlling accumulated resistance property of a ReRAM device is provided, wherein a first programming pulse set is firstly applied to a ReRAM device for acquiring a reference accumulated resistance distribution. According to the reference accumulated resistance distribution, a second programing pulse set in which at least one of the voltages, the currents and the pulse widths is different from that of the first programing pulse set is provided and then applied to perform an incremental step pulse programming (ISSP), so as to make the ReRAM device having a predetermined accumulated resistance distribution. Alternatively, several processes for manufacturing a ReRAM device having an oxygen control layer is adopted to adjusted an oxygen distribution of the oxygen control layer, so as to make the oxygen control layer of the ReRAM device having a predetermined oxygen distribution, and the ReRAM device can have a predetermined accumulated resistance distribution when a predetermined programing pulse set is applied thereon. By these approaches, the programming/erasing variations of the ReRAM device can be decreased, a multi-level-cell (MLC) application of the ReRAM device can be improved, and the ReRAM device can be more eligible for the NN systems.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for controlling accumulated resistance property of a ReRAM device comprising:

providing a ReRAM device including a first metal layer, a second metal layer, a first metal oxide layer and an oxygen control layer, wherein the first metal oxide layer is disposed between the first metal layer and the second metal layer; the oxygen control layer is disposed between the first metal oxide layer and one of the first metal layer and the second metal layer; and adjusting an oxygen content of the oxygen control layer to make the oxygen control layer having a predetermined accumulated resistance property when a predetermined programming pulse set is applied the ReRAM device, wherein the oxygen content of the oxygen control layer is gradually increased at a decreasing rate.

2. The method according to claim 1, wherein the oxygen content of the oxygen control layer is increased in gradient manner along a direction from the first metal oxide layer to one of the first metal layer and the second metal layer.

3. The method according to claim 2, wherein the oxygen content is increased along the direction to reach a first local maximum, then gradually decreased and further increased again to reach a second local maximum.

4. The method according to claim 2, wherein the ReRAM device further comprises a second metal oxide layer disposed between the oxygen control layer and the other one of the first metal layer and the second metal layer.

5. The method according to claim 1, wherein the oxygen control layer is formed by a deposition process.

6. The method according to claim 1, wherein the of adjusting the oxygen content of the oxygen control layer comprises applying a thermal stress to drive a plurality of oxygen atoms into the oxygen control layer from the first metal oxide layer.

\* \* \* \* \*